United States Patent [19]

Caley et al.

[11] 3,808,049

[45] Apr. 30, 1974

[54] MULTI-LAYER THIN-FILM CIRCUITS

[75] Inventors: Raymond H. Caley, Ottawa; Donald Mills, Kanata, Ontario, both of Canada

[73] Assignee: Microsystems International Limited, Quebec, Canada

[22] Filed: June 2, 1972

[21] Appl. No.: 259,243

[52] U.S. Cl. .............................. 117/212, 317/101 A

[51] Int. Cl. .............................. B44d 1/18

[58] Field of Search ........ 317/334 M, 238, 101 CM, 317/234 S; 117/217, 221; 333/84 M; 307/298; 161/196

[56] References Cited

UNITED STATES PATENTS

| | | | |
|---|---|---|---|
| 3,461,524 | 8/1969 | Lepselter | 317/101 |
| 3,682,766 | 8/1972 | Maher | 161/196 |

*Primary Examiner*—David Smith, Jr.

*Attorney, Agent, or Firm*—E. E. Pascal

[57] ABSTRACT

A multi-layer thin-film circuit using titanium as adhesive between the gold conductors and high-firing ceramic dielectric layers thereof. The invention teaches critical metallization and dielectric minimum thicknesses as well as teaching that the dielectric required must be of the crystallizable type.

1 Claim, No Drawings

MULTI-LAYER THIN-FILM CIRCUITS

The present invention relates to multi-layer thin-film electronic circuits wherein titanium is used as an adhesive between gold conductors and ceramic dielectric layers in such circuits.

Multi-layer circuits for use in applications where high frequencies of 100 megacycles or more are involved require thin-film metallization and thick-film dielectrics. The reasons are as follows. Thick-film metallization is inherently less stable than thin-film metallization, but in high frequency multi-layer circuits there are further problems with thick-film layers. To prevent parasitic capacitances and noise problems, it is desirable in such circuits to keep the components as closely interconnected as possible — i.e. to fabricate the circuit on a high-density basis. For this purpose, thick-film metallization cannot be defined sufficiently accurately to give the required patterns, therefore dictating the requirement for thin-film layers. A further problem with thick-film metallization in multi-layer circuits is the bumpy surface which results therefrom and which is reflected at the surface of the overlying dielectric. This creates the additional difficulty of bonding beam leads to the overlying layer, since such bonds require a relatively flat surface. Finally, there is, of course, the economical advantages of having high-density circuits made possible only with thin-film metallization.

The reason for using thick-film dielectrics in multi-layer circuits is to space the metallization layers by as much as possible to give minimum interlayer conductance and capacitance and, again, to avoid parasitics. Unfortunately, because low dielectric-constant dielectrics require relatively high firing temperatures (in excess of 800°C) the microelectronics industry has experienced great difficulty in finding an adhesive for the gold thin-film metallization commonly employed in multi-layer circuits. Indeed, titanium has been proposed as such adhesive, but only in relatively low temperature environments. For example, U.S. Pat. Nos. 3,442,701 and 3,287,612 (Lepselter) teaches a multi-metal systems consisting of, for example, gold, titanium and platinum up to temperatures of about 400°C. There are other patents showing the use of different metals under gold as adhesive and also showing titanium under aluminum, the titanium being chosen for its high melting point. However, these patents are generally concerned with the use of gold on silicon or silicon dioxide, wherein the use of high temperature firing steps is not required. As an adhesive in high-temperature environments, titanium is an obvious choice. Firstly, it is a better bonding agent than other metals — such as, for example, chromium, nichrome or molybdenum — and secondly it has a higher melting-point, as mentioned above. To my knowledge, the long-felt need for a viable multi-layer system using titanium/gold metallization with a high-firing dielectric has never been satisfied.

In a paper presented at the 1970 Fall Meeting of the American Ceramic Society Electronics Division and entitled "Thick Film Glass Insulated Crossovers For Thin Film Interconnection Networks," G.B. Fefferman describes experiments with titanium/gold systems for use with thick-film glass crossovers. The bottom and top layers of metallization were evaporated and electroplated gold over titanium and the intermediate insulating crossover layer was glass. The glass was fired to 870°C. which was necessary to form the insulating layer, whereupon it was observed that blistering and discoloration of the conductors occurred. Thereafter, Fefferman discarded titanium as a viable adhesive for the gold and went on to consider alternative metals. However, Fefferman failed to appreciate a critical factor, i.e. that the blistering and discoloration of the conductors was not due simply to intermetallic diffusion, as he assumed, but was due to reaction of the titanium with the glass after such diffusion had occurred. Also, we have found that the conductor layer thicknesses are critical and must be maintained within certain parameters. Thus, it is the object of the present invention to discover a type of dielectric with which the gold-titanium layers will not react during firing and also to determine the layer thicknesses which must be adhered to.

Thus, according to the present invention we provide a multi-layer circuit device comprising a plurality of thick-film substrate layers, having thin-film metallization layers therebetween, said substrate layers being formed from high-firing crystallizable dielectric material and said metallization layers comprising titanium deposited to a thickness of at least about 1500 Angstroms and gold deposited thereover to a thickness of at least about 30,000 Angstroms.

According to a further embodiment of the invention there is provided a method of fabricating multi-layer structures as defined above.

The invention will now be described further by way of example only.

A variety of experiments were performed in order to determine the necessary parameters for the present invention and these were performed as follows.

A number of ceramic substrates were cleaned as follows. After immersion in J–100 solution (90–100*c*) for 15 minutes, the substrates were spray-rinsed in deionised water for a further 15 minutes followed by a second spray-rinse. The substrates were then dried in an isopropyl alcohol degreaser and baked for 30 minutes at 115°C.

The substrates were standard alumina ceramic substrates manufactured by Duplate Company of Ottawa, Canada, under the trade designation DCL–200. A number of glass slides were also prepared, these being for monitoring the thickness of metals deposited up the substrates as explained hereinafter.

EXAMPLE 1

Eight substrates and five glass slides prepared as above were loaded into an evaporator. Titanium wire was then loaded into tungsten boats and gold pellets were loaded into a molybdenum boat, sufficient titanium being used to deposit a 1,700 Angstroms thickness upon the substrates and slides and sufficient gold being used to deposit 5,000 Angstroms. Prior to evaporation upon the substrates and slides, which were held at a temperature of 250°C, the titanium and gold were outgassed to a molten state. At a bell-jar pressure of $1.5 \times 10^{-5}$ torr, titanium was evaporated. Gettering by titanium dropped the pressure to $2.5 \times 10^{-6}$ torr. Gold evaporation commenced 10 –15 seconds after termination of titanium evaporation. The vacuum was broken and two substrates and one glass slide were removed. By suitable standard photoresist and etching techniques, the gold and titanium thicknesses on the glass slide were measured. Since it is virtually impossible to measure accurately the depth of deposition of metal upon a ceramic substrate, the deposition thickness on the glass slide was measured as a convenient monitor. Enough gold was now reloaded to deposit another 5,000 Angstroms upon the remaining substrates and slides, and the system was evacuated to $8 \times 10^{-6}$ torr. After this stage a further two substrates and a slide were removed and again the thickness was measured. This process continued until samples had been obtained of 5000, 10,000, 20,000 and 30,000 Angstroms of gold respectively upon 1700 Angstroms of titanium.

All the specimens were then loaded onto the belt of a standard thick-film firing furnace and cycled through the furnace for 50 minutes with a peak temperature of 850°C. for 8 minutes at such temperature. Firing was repeated, since this would normally be required for producing a multi-layer substrate.

Two qualitative tests were conducted to assess the adhesion of the metals after firing. A tape test gave an indication of the strength of the metallization in non-bonding situations and this involved applying to the metallization a piece of "Scotch Brand" (registered trade mark) adhesive tape manufactured by the Minnesota Mining Company of St. Paul, Minnesota, U.S.A. The adhesion of the metallization to the substrate is then determined by whether or not it can be pulled away under the influence of the adhesive tape. It was found that all of the samples passed this test. The second test employed was to scratch the metallization surface with a knife in order to determine the suitability of the metallization for external operations such as, for example, ultrasonic bonding and beam lead bonding. The 5,000 Angstrom gold sample showed only weak resistance to scraping away from the titanium. The 10,000 and 20,000 gold thickness samples scraped away from the substrate and it was found that the titanium layer underneath had disappeared, probably having diffused into the gold. The 30,000 Angstroms thickness gold sample could not be removed by scraping.

Therefore, it was concluded that for a 1,700 Angstroms titanium layer, gold loses adhesion after firing if the gold thickness is lower than some value in the 20,000 to 30,000 Angstrom range.

EXAMPLE 2

The experimental conditions of Example 1 were repeated except that now the gold thickness was maintained constant at 40,000 Angstroms and the titanium thickness was varied between 800, 1,500, 1,700 and 2,000 Angstroms. The tape and scratch tests were again applied and it was found that the 800 Angstroms titanium film sample showed failure under tape testing. Scratching removed all the gold and no titanium was revealed beneath. The remaining samples passed both tape and scratch testing, but the 1,500 Angstrom titanium sample indicated only marginal resistance to scratching. Aluminum wire was then ultrasonically bonded to the gold layer overlying the 1,700 Angstroms titanium layer and the strength of the bond measured by a pull test. The measured required pull was 6 to 7 grams, which is satisfactory for such a bond.

The conclusion to be drawn from examples 1 and 2 is that the titanium thickness must be maintained to at least 1,500 Angstroms and that the gold thickness cannot be less than a value within the 20,000 to 30,000 Angstrom range. 30,000 Angstroms is a safe lower limit for the gold thickness.

Further experiments to determine the effect of the dielectric material upon the gold-titanium system were conducted, as described below.

EXAMPLE 3

A standard non-crystallizable dielectric as commonly employed in the manufacture of thick and thin-film devices — and of the type used by Fefferman in the experiments referred to above — was investigated. The dielectric chosen was one of the most commonly available and manufactured by E.I. Dupont De Nemours & Company of Wilmington, Delaware, U.S.A. under the trade designation "8190."

A series of titanium-gold systems were prepared as above, the titanium layer thickness being 1750 Angstroms and the gold layer thickness being 40,000 Angstroms. A pattern of lines 5 mils wide was defined in the metallization by etching and the dielectric screened, dried and fired. Windows were then etched in the dielectric to permit access to the metallization so that resistivity measurements could be performed. The resistivity change in the metallization after firing as a percentage of the resistivity before firing was measured and the effect of the dielectric upon the metallization visually observed.

After one firing at 850°C, an increase in resistivity of between 15 and 50 percent was measured. The metallization appeared black beneath the dielectric but a golden colour elsewhere.

After a second firing at 850°C, the resistivity change from the pre-fired dropped to between 5 percent decrease and 15 percent increase. However, after this second firing, the metallization of some lines was obviously thinned and even opened in places. These spots were coincident with bubbles in the dielectric.

After firing a fresh sample at 900°C, the resistivity change was from zero to 20 percent increase. The appearance of the sample was similar to that after a single firing at 850°C.

After firing the second sample again at 900°C the resistivity change was from a decrease of 10 percent of the pre-fired value to an increase of 10 percent. Now visual observation showed numerous openings in the metallization, coincident with bubbles in the dielectric.

The above results generally confirmed the Fefferman results — although Fefferman was not aware of any criticality of the metallization layer thicknesses — and it was decided to investigate the reasons for the discoloration, and general degradation of the metallization.

EXAMPLE 4

A further series of titanium-gold systems was prepared as above and the samples fired to investigate the extent of degradation of the metallization with no dielectric present.

After one firing at 850°C, the resistivity dropped by 2 percent and after two firings, the resistivity dropped by 10 percent of the pre-fired value.

After one firing at 900°C, the resistivity dropped by 10 percent and after two firings, the resistivity dropped by as much as 25 percent, although in the latter case, adhesion of the metallization suffered.

During the firings, intermetallic diffusion was observed to occur, but no degradation of the metallization was noticed except after the second firing at 900°C. Therefore, it was concluded that simply firing the metallization at high temperatures was not responsible for the problems encountered by previous workers, such as Fefferman, even though intermetallic diffusion was clearly seen to occur. It was realized that the dielectric must in some way be reacting with or physically combining with the metallization during the firing cycle. The viscosity of the "8190" dielectric dropped markedly during firing, presumably enhancing any chemical or physical reactions which might take place with the metallization. With this factor in mind, it was realized that a crystallizable dielectric — which is much more viscous at the firing temperatures — should display better immunity to chemical or physical reaction with the metallization than a standard non-crystallizable dielectric, such as the Dupont "8190." The crystallizable dielectric employed in the following example was manufactured by E.I. Dupont De Nemours & Company under the trade designation "8299" and contains titanium oxide as nucleating agent, which it was felt, might also be effective to some extent in inhibiting reaction with the metallization. Alternatively trade designation type 8771 also manufactured by the E.I. Dupont de Nemours & Company can be used as the crystallizable dielectric.

EXAMPLE 5

A further series of titanium-gold systems was prepared as above with 5 mil lines and the crystallizable dielectric screened thereupon dried and fired.

After one firing at 850°C, the resistivity increased by 4 to 6 percent, no discoloration or degradation of the metallization being noted.

After two firings at 850°C, the resistivity increase over the pre-fired value was only 1 percent. Still no discoloration or degradation was observed.

Similar results were found with one and two firings at 900°C.

The conclusions drawn from the above experiments are that acceptable multi-layer circuits can be fabricated using titanium-gold metallization and a crystallizable dielectric, providing the metallization thicknesses are maintained within the parameters as aforesaid. The mechanism by which the metallization remains relatively inert to attack by the crystallizable dielectric is not clear. Examination of the same fired samples and analysis of the dielectric indicate that the predominant factor is the high viscosity of the crystallizable dielectric compared to the low viscosity of the non-crystallizable dielectric. However, it is believed that the presence of titanium as the nucleating agent for crystallization might also have some effect and it is believed that the presence of a titanium compound in the dielectric is a desirable feature.

Therefore, we have disclosed and described a significant advance in the technology of multi-layer microelectronic circuits, whereby, by appropriate election of dielectric and metallization layer thickness, gold may be employed as the primary metallization with titanium therebeneath as adhesive.

Various further embodiments and modifications of the invention will be apparent to those skilled in the art without departing from the spirit and scope of the invention described herein and defined by the claims appended hereto.

What is claimed is:

1. A method of fabricating a multi-layer microelectronic circuit device which comprises the steps of depositing a thin film layer of titanium to a thickness of at least about 1,500 Angstroms upon a substrate, depositing upon the said titanium layer a thin-film gold layer to a thickness of at least about 30,000 Angstroms, depositing over said gold layer a thick-film high-firing crystallizable dielectric layer, firing said dielectric layer at a temperature between about 850°C and 900°C, and forming upon said dielectric layer further titanium, gold and dielectric layers as hereinbefore defined and in the sequence as aforesaid.

* * * * *